United States Patent
Baratam (10) Patent No.: US 11,456,727 B2
(45) Date of Patent: Sep. 27, 2022

(54) LATCH ARCHITECTURE FOR LOW POWER APPLICATIONS

(71) Applicant: Arm Limited, Cambridge (GB)

(72) Inventor: Anil Kumar Baratam, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/075,614

(22) Filed: Oct. 20, 2020

(65) Prior Publication Data

US 2022/0123737 A1 Apr. 21, 2022

(51) Int. Cl.
*H03K 3/037* (2006.01)
*H03K 3/012* (2006.01)

(52) U.S. Cl.
CPC ........... *H03K 3/0372* (2013.01); *H03K 3/012* (2013.01)

(58) Field of Classification Search
CPC .............................. H03K 3/0372; H03K 3/012
See application file for complete search history.

(56) References Cited

U.S. PATENT DOCUMENTS

| | | | | |
|---|---|---|---|---|
| 6,323,710 B1* | 11/2001 | Piguet | ................. | H03K 3/0372 327/202 |
| 7,495,466 B1* | 2/2009 | Pitkethly | ................ | H03K 3/012 326/26 |
| 9,503,069 B1* | 11/2016 | Cyrusian | .......... | H03K 3/356113 |
| 2009/0085629 A1* | 4/2009 | Harris | .............. | H03K 3/356104 327/218 |
| 2021/0288633 A1* | 9/2021 | Kuenemund | .... | H03K 3/356008 |

* cited by examiner

*Primary Examiner* — Sibin Chen
(74) *Attorney, Agent, or Firm* — Pramudji Law Group PLLC; Ari Pramudji (57) ABSTRACT

Various implementations described herein are directed to a device having multiple stages. The device may have a first stage that provides a data path for an input data signal. The first stage may receive the input data signal, receive feedback signals, and provide an intermediate data signal based on the input data signal and/or the feedback signals. The device may have a second stage that provides set/reset signals based on the intermediate data signal and/or a clock signal. The second stage may receive the intermediate data signal, receive the clock signal, and generate the set/reset signals based on the intermediate data signal and the clock signal. The second stage may also provide the set/reset signals as the feedback signals to the first stage.

12 Claims, 8 Drawing Sheets

LATCH ARCHITECTURE FOR LOW POWER APPLICATIONS

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some latching architecture designs, conventional use of flip-flops are critical to many circuit designs. However, in conventional circuit designs, traditional flip-flops are power sinks that tend to waste power through leakage and by having a large area. Also, conventional circuit designs that implement traditional flip-flops typically have a low yield, which often results in inefficient use of chip space. As such, there exists a need to improve conventional flip-flop circuit designs to improve area efficiency of modern flip-flop latching architecture for many different types of low power applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to flip-flop (FF) latching architecture along with various set-reset (SR) signal generation circuitry in physical layout design. For instance, the various schemes and techniques described herein may provide for a low power flip-flop family of physical devices that use less area and provide improved yield in various low power applications. In some implementations, the low power flip-flop (FF) latching architecture described herein may provide circuitry that utilizes NAND based FF circuitry and/or NOR based FF circuitry having an optimized physical layout structure with less transistors and/or less toggling elements so as to save power.

In some implementations, the low power flip-flop (FF) latching architecture may refer to a multi-stage device that is designed for low power applications. For instance, the low power flip-flop (FF) latching architecture may include a first stage that provides a data path for an input data signal, wherein the first stage may receive the input data signal, receive feedback signals, and provide an intermediate data signal based on the input data signal and the feedback signals. Also, the low power FF latching architecture may include a second stage that provides set/reset signals based on the intermediate data signal and a clock signal, wherein the second stage receives the intermediate data signal, receives the clock signal, and generates the set/reset signals based on the intermediate data signal and the clock signal. The second stage may provide the set/reset signals as the feedback signals to the first stage. The multi-stage device may operate as a latch, wherein the first stage and the second stage may operate together as a clock gating latch. The low power flip-flop (FF) latching architecture may also include a third stage that receives the set/reset signals from the second stage and provides an output data signal based on the set/reset signals, and also, the third stage may be configured to operate as a slave latch.

Various implementations of flip-flop (FF) latching architecture along with various novel set-reset (SR) signal generation schemes and techniques associated therewith will be described in greater detail herein with reference to FIGS. 1-6D.

Figure 1:
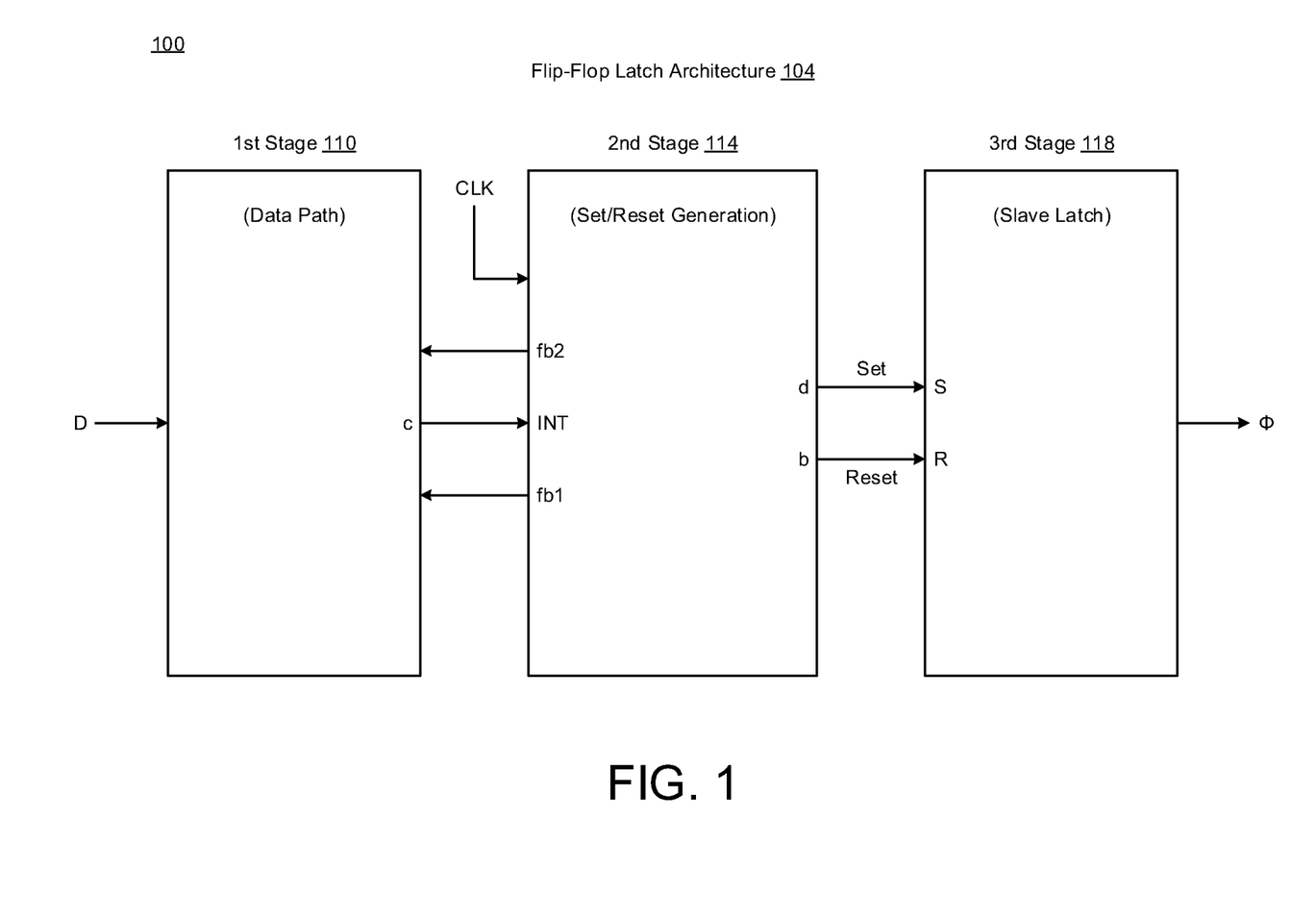
FIG. 1 illustrates a diagram of flip-flop (FF) latch architecture in accordance with various implementations described herein.

FIG. 1 illustrates a schematic diagram 100 of multi-stage flip-flop (FF) latching architecture 104 in accordance with various implementations described herein.

In some implementations, the multi-stage architecture 104 may be implemented as a system or a device having integrated circuit (IC) components that are arranged and coupled together as an assemblage or combination of parts that provide for physical circuit designs and related structures. In some instances, a method of designing, providing and building the multi-stage architecture 104 as an integrated system or device may involve use of various IC circuit components described herein so as to implement set-reset signal generation schemes and techniques associated therewith. The multi-stage architecture 104 may be integrated with computing circuitry and related components on a single chip, and the multi-stage architecture 104 may be implemented in various embedded systems for automotive, electronic, mobile, server and Internet-of-things (IoT) applications.

As shown in FIG. 1, the multi-stage flip-flop (FF) latching architecture 104 has multiple stages, such as, e.g., one or more of a first stage 110, a second stage 114, and a third stage that are coupled together to perform various logical behaviors. For instance, in various implementations, the multi-stage architecture 104 may be configured to operate as a latch, and also, in other implementations, the first stage 110 and the second stage 114 may be configured to operate together as a clock gating latch.

The first stage 110 may provides a data path for an input data signal (D). The first stage 110 may receive the input data signal (D), receive one or more feedback signals (fb1, fb2), and provide an intermediate data signal (INT) as output at output node (c) based on the input data signal (D) and/or the one or more feedback signals (fb1, fb2).

The second stage 114 may generate and provide set/reset signals (S, R) based on the intermediate data signal (INT) and/or a clock signal (CLK). The second stage 114 may receive the intermediate data signal (INT) from the first stage 110, receive the clock signal (CLK) from an external source, and generate the set/reset signals (S, R) as output at output nodes (b, d) based on the intermediate data signal (INT) and/or the clock signal (CLK). In some instances, the second stage 114 may provide the set/reset signals (S, R) as the one or more feedback signals (fb1, fb2) to the first stage 110.

The third stage 118 may receive the set/reset signals (S, R) from the second stage 114 and provide an output data signal (phi φ) based on the set/reset signals (S, R), and the third stage 118 may be configured to operate as a slave latch.

Figure 2:
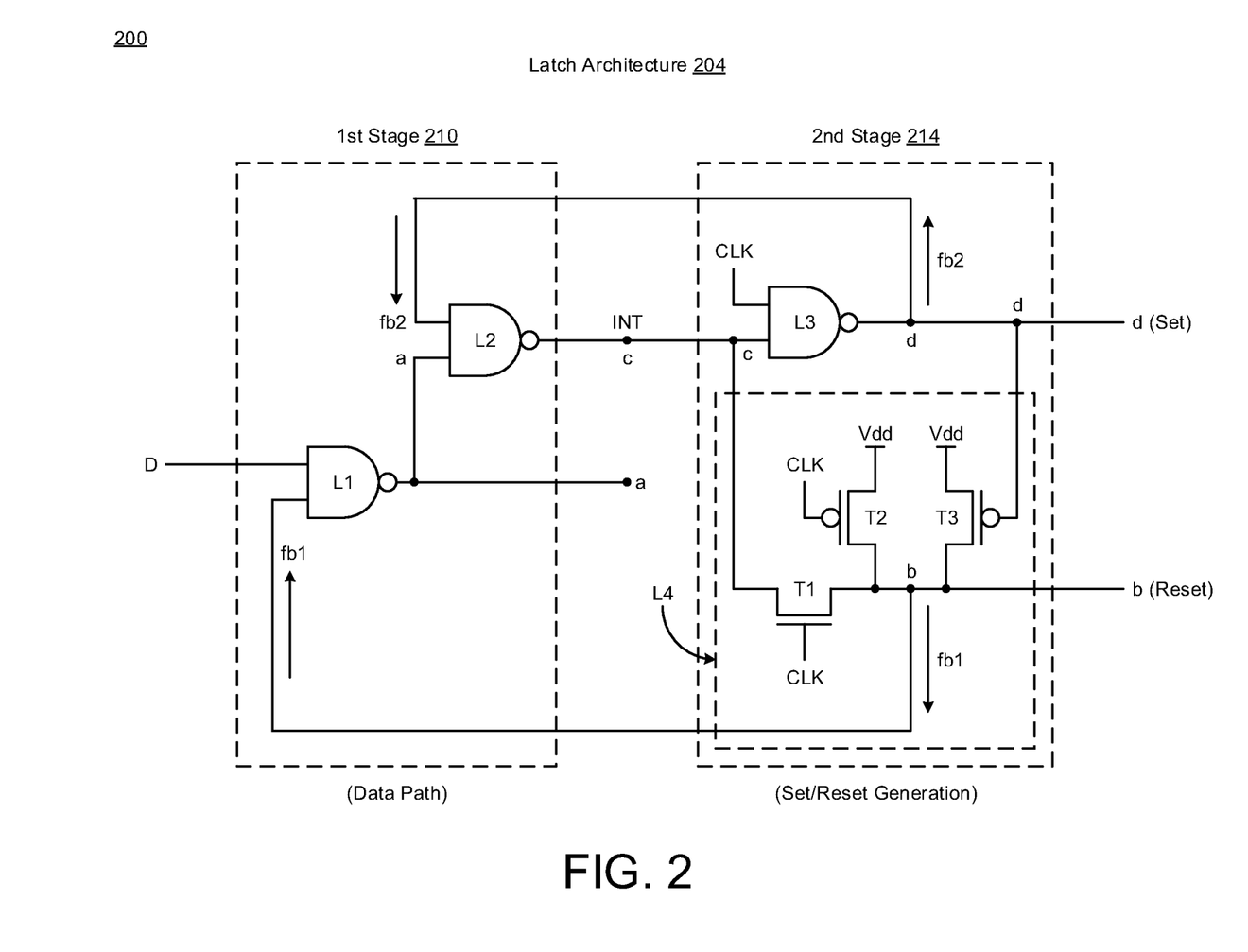
FIG. 2 illustrates a schematic diagram of latch architecture in accordance with various implementations described herein.

FIG. 2 illustrates a schematic diagram 200 of multi-stage latching architecture 204 in accordance with various implementations described herein. In various instances, the first and second stages 210, 214 in FIG. 2 are similar in scope, behavior and function as the first and second stages 110, 114 in FIG. 1.

In some implementations, the multi-stage architecture 204 may be implemented as a system or a device having integrated circuit (IC) components that are arranged and coupled together as an assemblage or combination of parts that provide for physical circuit designs and related structures. In some instances, a method of designing, providing and building the multi-stage architecture 204 as an integrated system or device may involve use of various IC circuit components described herein so as to implement set-reset signal generation schemes and techniques associated therewith. The multi-stage architecture 204 may be integrated with computing circuitry and related components on a single chip, and the multi-stage architecture 204 may be implemented in various embedded systems for automotive, electronic, mobile, server and Internet-of-things (IoT) applications.

As shown in FIG. 2, the multi-stage latch architecture 204 may have multiple stages, including, e.g., a first stage 210 and a second stage 214 that are coupled together to perform various logical behaviors. In some instances, the multi-stage architecture 204 may be configured to operate as a latch, and in other instances, the first stage 210 and the second stage 214 may operate together as a clock gating latch. Also, the first stage 210 may be configured to provide a data path for the input data signal (D), and the second stage 214 may be configured to provide for set-reset signal generation.

The first stage 210 may include first logic (L1) that receives the input data signal (D) from an external source, receives a first feedback signal (fb1) of the feedback signals (fb1, fb2) from the second stage 214 at node (b), and provides a first logic signal as output at node (a). The first stage 210 may include second logic (L2) that receives the first logic signal from the first logic (L1) at node (a), receives a second feedback signal (fb2) of the feedback signals (fb1, fb2) from the second stage 214 at node (d), and then provides the intermediate data signal (INT) as output at node (c) to the second stage 214. In various implementations, the first logic (L1) and/or the second logic (L2) may include various types of logic gates, such as, e.g., NAND gates. However, various other relevant configurations of different logic gates may be used to implement similar logical behaviors.

The second stage 214 may include third logic (L3) that receives the clock signal (CLK) from an external source, receives the intermediate data signal (INT) at node (c) from the second logic (L2) of the first stage 110, and provides a third logic signal at node (d) as a set signal (set) of the set/reset signals. The second stage 214 may include fourth logic (L4) that receives the intermediate data signal (INT) at node (c) from the second logic (L2) of the first stage 110, receives the set signal (set) from the third logic (L3) at node (d), and then provides a fourth logic signal at node (b) as a reset signal (reset) of the set/reset signals. At node (b), the reset signal (reset) may be provided to the first logic (L1) as the first feedback signal (fb1), and at node (d), the set signal (set) may be provided to the second logic (L2) as the second feedback signal (fb2).

In some implementations, the third logic (L3) may include various types of logic gates, such as, e.g., a NAND gate, or similar. However, other relevant configurations of different logic gates may be used to implement similar logical behaviors.

Also, in some implementations, the fourth logic (L4) may include various types of transistor configurations, such as, e.g., PMOS and NMOS transistors. For instance, a first transistor (T1) may be coupled between node (c) and node (b), and also, a second transistor (T2) may be coupled between a power supply (Vdd) and node (b), and also, a third transistor (T3) may be coupled between a power supply (Vdd) and node (b). In some instances, the first transistor (T1) may be activated/deactivated by the clock signal (CLK), the second transistor (T2) may be activated/deactivated by the clock signal (CLK), and the third transistor (T3) may be activated/deactivated by node (d). However, various other relevant transistor configurations may be used to implement similar logical behaviors.

Figure 3:
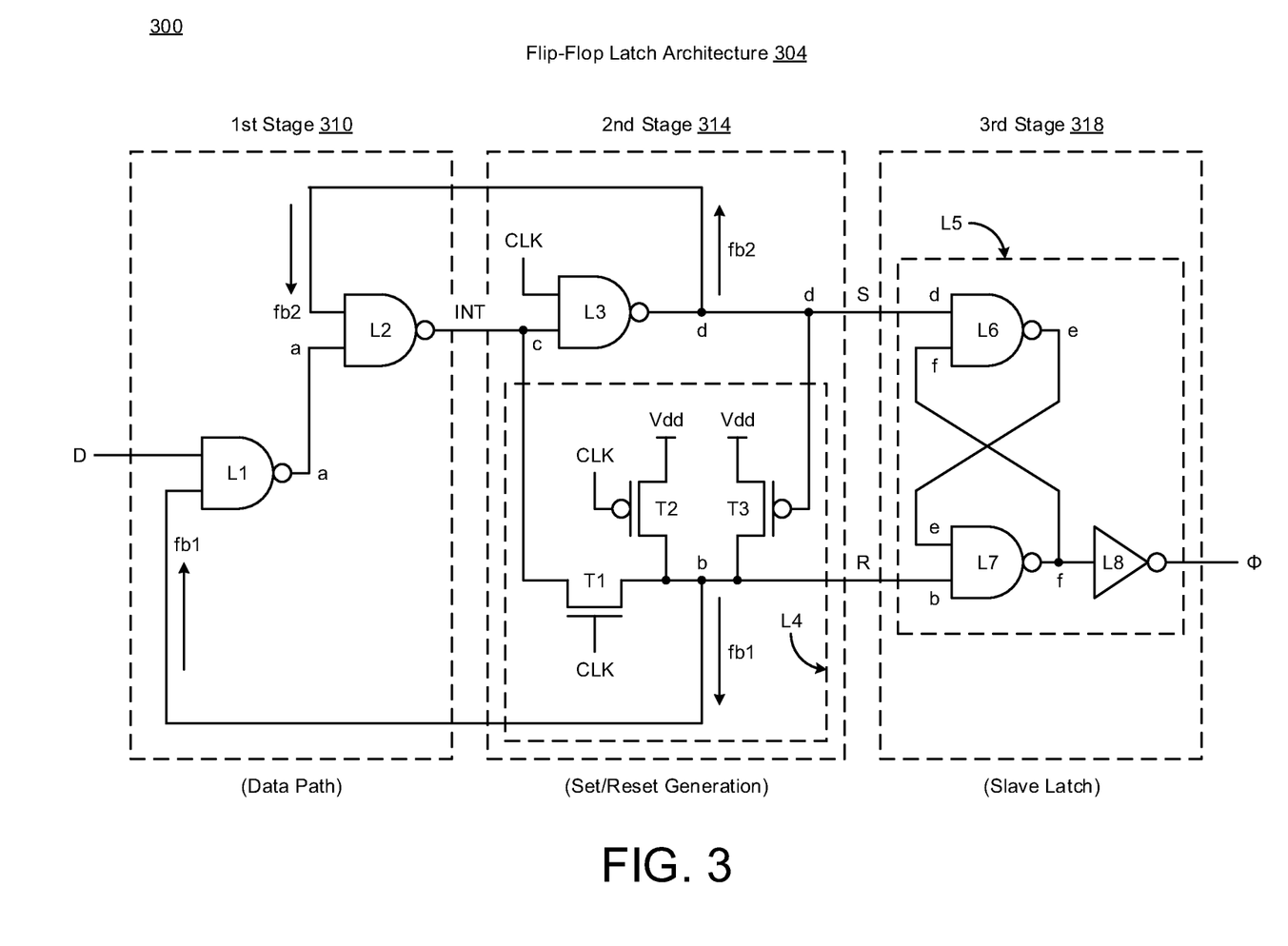
FIG. 3 illustrates a diagram of flip-flop (FF) latch architecture in accordance with various implementations described herein.

FIG. 3 illustrates a schematic diagram 300 of flip-flop (FF) latch architecture 304 in accordance with various implementations described herein. In various instances, the first, second and third stages 310, 314, 318 in FIG. 3 are similar in scope, behavior and function as the first, second and third stages 110, 114, 118 in FIG. 1.

In some implementations, the multi-stage architecture 304 may be implemented as a system or a device having integrated circuit (IC) components that are arranged and coupled together as an assemblage or combination of parts that provide for physical circuit designs and related structures. In some instances, a method of designing, providing and building the multi-stage architecture 304 as an integrated system or device may involve use of various IC circuit components described herein so as to implement set-reset signal generation schemes and techniques associated therewith. The multi-stage architecture 304 may be integrated with computing circuitry and related components on a single chip, and the multi-stage architecture 304 may be implemented in various embedded systems for automotive, electronic, mobile, server and Internet-of-things (IoT) applications.

As shown in FIG. 3, the multi-stage latch architecture 304 may have multiple stages, including, e.g., a first stage 310 and a second stage 314 that are coupled together to perform various logical behaviors. In some instances, the first and second stages 310, 314 in FIG. 3 are similar in scope and function as the first and second stages 210, 214 in FIG. 2. Also, in some instances, the multi-stage architecture 304 may be configured to operate as a latch, and in other instances, the first stage 310 and the second stage 314 may operate together as a clock gating latch. Also, the first stage 310 may be configured to provide a data path for the input data signal (D), and the second stage 314 may be configured to provide for set-reset (S-R) signal generation.

The multi-stage latch architecture 304 may also include a third stage 318 that receives the set/reset signals (S, R) from the second stage 314 at nodes (b, d) and then provides an output data signal (phi φ) based on the set/reset signals (S, R). As described herein, the third stage 318 may be configured to operate as a slave latch. The third stage 318 may include fifth logic (L5) that receives the set signal (S) from the third logic (L3) of the second stage 314, receives the reset signal (R) from the fourth logic (L4), and provides the output data signal (phi φ) based on the set signal (S) and the reset signal (R).

In some implementations, the fifth logic (L5) may have various other logic, such as, e.g., sixth logic (L6), seventh logic (L7) and/or eighth logic (L8). For instance, the sixth logic (L6) may receive the set signal (S) at node (d), receive an output signal at node (f) from the seventh logic (L7), and provide an output signal at node (e). The seventh logic (L7) may receive the reset signal (R) at node (b), receive an output signal at node (e) from the sixth logic (L6), and provide the output signal at node (f). The eighth logic (L8) may receive the output signal at node (f) from the seventh logic (L7) and provide the output data signal (phi φ) as output from the third stage 318.

In some implementations, the sixth logic (L6) and/or the seventh logic (L7) may have various types of logic gates, such as, e.g., NAND gates. Also, the eighth logic (L8) may include various types of logic gates, such as, e.g., an inverter gate. However, various other relevant configurations of different logic gates may be used to implement similar logical behaviors as described herein.

In reference to FIG. 3, various implementations described herein are directed to flip-flop (FF) latching architecture having multiple stages including a first stage 310 and a second stage 314. For instance, the first stage 310 may have first NAND logic (L1, L2) that is configured to receive the input data signal (D), receive feedback signals (fb1, fb2), and provide the intermediate data signal (INT) based on the input data signal (D) and the feedback signals (fb1, fb2). The second stage 314 may have second NAND logic (L3, L4) that is configured to receive the intermediate data signal (INT), receive a clock signal (CLK), and generate set/reset signals (S, R) based on the intermediate data signal (INT) and the clock signal (CLK). The second NAND logic (L3, L4) may provide the set/reset signals (S, R) as the feedback signals (fb1, fb2) to the first NAND logic (L1, L2).

In some implementations, the first NAND logic (L1, L2) may have a first NAND gate (L1) that receives the input data signal (D), receives the first feedback signal (fb1) of the feedback signals (fb1, fb2) from the second NAND logic (L3, L4), and then provides a first logic signal as output at output node (a). The first NAND logic (L1) may have a second NAND gate (L2) that receives the first logic signal at node (a) from the first NAND gate (L1), receives the second feedback signal (fb2) of the feedback signals (fb1, fb2) from the second NAND logic (L3, L4), and then provides the intermediate data signal (INT) to the second NAND logic (L3, L4).

In some implementations, the second NAND logic (L3, L4) may include a third NAND gate (L3) that receives the clock signal (CLK), receives the intermediate data signal (INT) at node (c) from the second NAND gate (L2), and then provides a third logic signal at node (d) as a set signal (set) of the set/reset signals. The second NAND logic (L3, L4) may have a fourth logic gate (L4) that receives the intermediate data signal (INT) at node (c) from the second NAND gate (L2), receives the set signal (set) from the third NAND gate (L3), and then provides a fourth logic signal at node (b) as a reset signal (reset) of the set/reset signals.

Moreover, in some implementations, the multiple stages may have a third stage 318 with third NAND logic (L5) that receives the set/reset signals (S, R) from the second NAND logic (L3, L4) and then provides an output data signal (phi φ) based on the set/reset signals (S, R). The third stage 318 may be configured to operate as a slave latch. Also, the third NAND logic (L5) has multiple logic gates (L6, L7, L8) that receive the set signal (set) at node (d) from the third NAND gate (L3), receive the reset signal (reset) at node (b) from the fourth logic gate (L4), and then provide the output data signal (phi φ) based on the set signal (set) and/or the reset signal (reset).

Also, in reference to an embodiment of operating the NAND based flip-flop (FF) architecture 304, the flowing truth table may be utilized in Table 1.

TABLE 1

| D | CLK | a | b | c | d | $e_n$ | $f_n$ | $\Phi_n$ |
|---|---|---|---|---|---|---|---|---|
| x | 0 | nD | 1 | D | 1 | $e_{n-1}$ | $f_{n-1}$ | $\Phi_{n-1}$ |
| 0 | 1 | 1 | 0 | 0 | 1 | 0 | 1 | 0 |
| 1 | 1 | 0 | 1 | 1 | 0 | 1 | 0 | 1 |

Figure 4A:
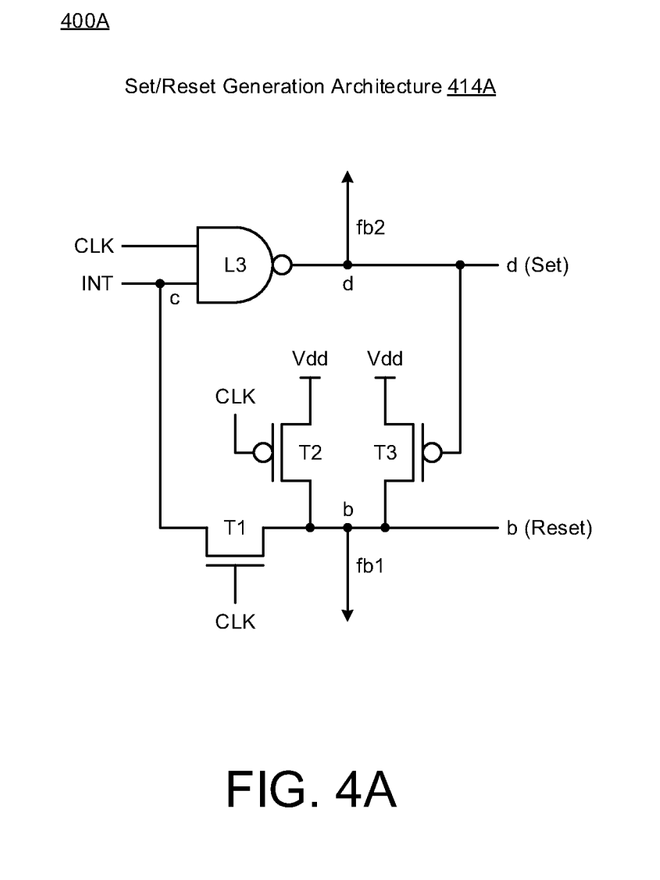
FIGS. 4A-4D illustrate various diagrams of set/reset generation architecture in accordance with various implementations described herein.
Figure 4B:
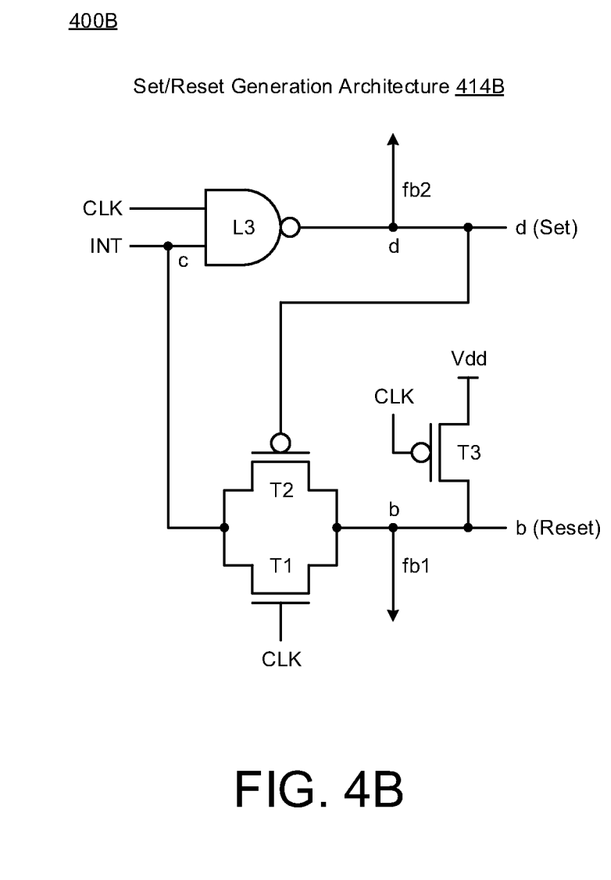
Figure 4C:
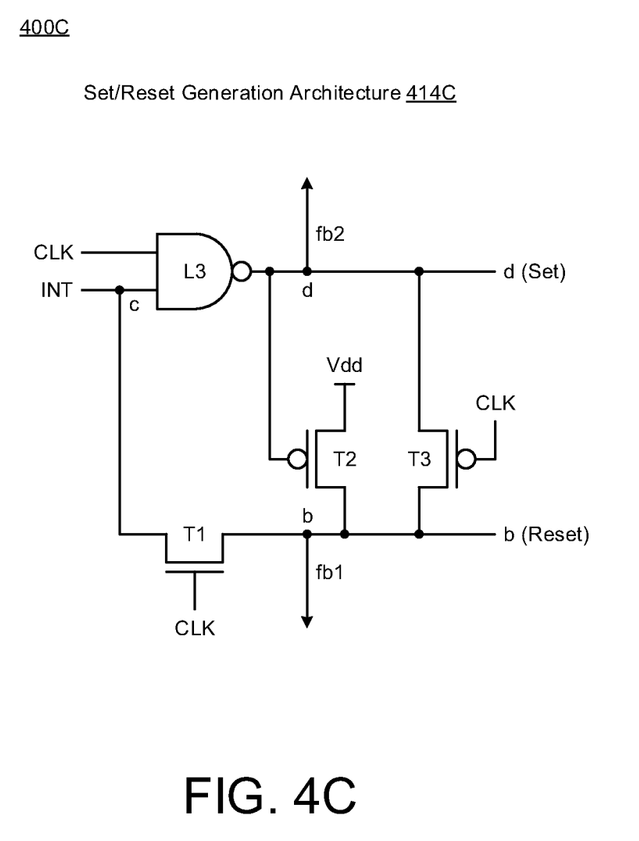
Figure 4D:
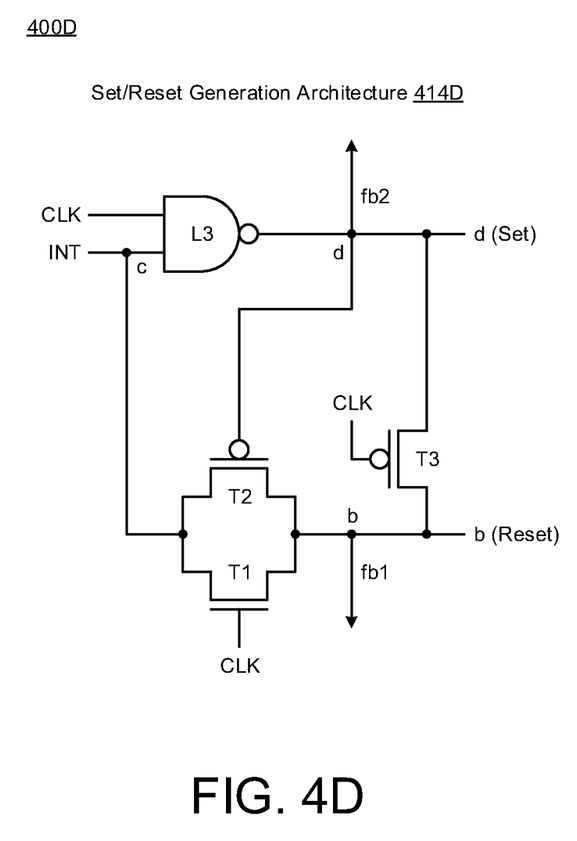

FIGS. 4A-4D illustrate various diagrams of set/reset generation architecture 414 in accordance with implementations described herein. In particular, FIG. 4A shows a first configuration diagram 400A of set/reset generation architecture 414A, FIG. 4B shows a second configuration diagram 400B of set/reset generation architecture 414B, FIG. 4C shows a third configuration diagram 400C of set/reset generation architecture 414C, and FIG. 4D shows a fourth configuration diagram 400D of set/reset generation architecture 414D. In some instances, the set/reset generation architectures 414A, 414B, 414C, 414D shown in FIGS. 4A-4D may be alternatively used for logic circuitry provided in the second stage 314 shown in FIG. 3.

As shown in FIG. 4A, the set/reset generation architecture 414A may include the third logic (L3) that receives the clock signal (CLK), receives the intermediate signal (INT), and provides the set signal (set) at node (d). Also, the feedback signal (fb2) may be taken from node (d). The set/reset generation architecture 414A may have the multiple transistors (T1, T2, T3). The first transistor (T1) receives the intermediate signal (INT) at node (c) and then provides the reset signal (reset) at node (b) when activated by the clock signal (CLK). The second transistor (T2) receives and provides the voltage supply (Vdd) to node (b) when activated by the clock signal (CLK), and the third transistor (T3) receives and provides the voltage supply (Vdd) to node (b) when activated by the set signal (set) from node (d). Also, the feedback signal (fb1) may be taken from node (b).

As shown in FIG. 4B, the set/reset generation architecture 414B may include the third logic (L3) that receives the clock signal (CLK), receives the intermediate signal (INT), and provides the set signal (set) at node (d). Also, the feedback signal (fb2) may be taken from node (d). The set/reset generation architecture 414B may have the multiple transistors (T1, T2, T3). The first transistor (T1) receives the intermediate signal (INT) at node (c) and then provides the reset signal (reset) at node (b) when activated by the clock signal (CLK). The second transistor (T2) receives the intermediate signal (INT) at node (c) and then provides the reset signal (reset) at node (b) when activated by the set signal (set) from node (d). Also, the third transistor (T3) receives and provides the voltage supply (Vdd) to node (b) when activated by the clock signal (CLK). Also, the first feedback signal (fb1) may be taken from node (b).

As shown in FIG. 4C, the set/reset generation architecture 414C may include the third logic (L3) that receives the clock signal (CLK), receives the intermediate signal (INT), and provides the set signal (set) at node (d). Also, the feedback signal (fb2) may be taken from node (d). The set/reset generation architecture 414C may have the multiple transistors (T1, T2, T3). The first transistor (T1) receives the intermediate signal (INT) at node (c) and then provides the reset signal (reset) at node (b) when activated by the clock signal (CLK). The second transistor (T2) receives and provides the voltage supply (Vdd) to node (b) when activated by the set signal (set) from node (d). Also, the third transistor (T3) receives the set signal (set) from node (d) and provides the reset signal (reset) to node (b) when activated by the clock signal (CLK). Further, the first feedback signal (fb1) may be taken from node (b).

As shown in FIG. 4D, the set/reset generation architecture 414B may include the third logic (L3) that receives the clock signal (CLK), receives the intermediate signal (INT), and provides the set signal (set) at node (d). Also, the feedback signal (fb2) may be taken from node (d). The set/reset generation architecture 414D may have the multiple transistors (T1, T2, T3). The first transistor (T1) receives the intermediate signal (INT) at node (c) and then provides the reset signal (reset) at node (b) when activated by the clock signal (CLK). The second transistor (T2) receives the intermediate signal (INT) at node (c) and then provides the reset signal (reset) at node (b) when activated by the set signal (set) from node (d). The third transistor (T3) receives the set signal (set) from node (d) and then provides the reset signal (reset) to node (b) when activated by the clock signal (CLK). Further, the first feedback signal (fb1) may be taken from node (b).

In some implementations, the third logic (L3) may refer to various types of logic gates, such as, e.g., a NAND gate, or similar. However, other relevant configurations of different logic gates may be used to implement similar logical behaviors. Also, in some implementations, transistors (T1, T2, T3) may refer to various types of transistors, such as, e.g., PMOS and NMOS transistors. In various instances, the first transistor (T1) may refer to an NMOS transistor, the second transistor (T2) may refer to a PMOS transistor, and the third transistor (T3) may refer to a PMOS transistor that may be coupled together in the different configurations, e.g., as shown in FIGS. 4A-4D. However, various other relevant transistor configurations may be utilized to implement similar logical behaviors, characteristics and/or features that are described herein.

Figure 5:
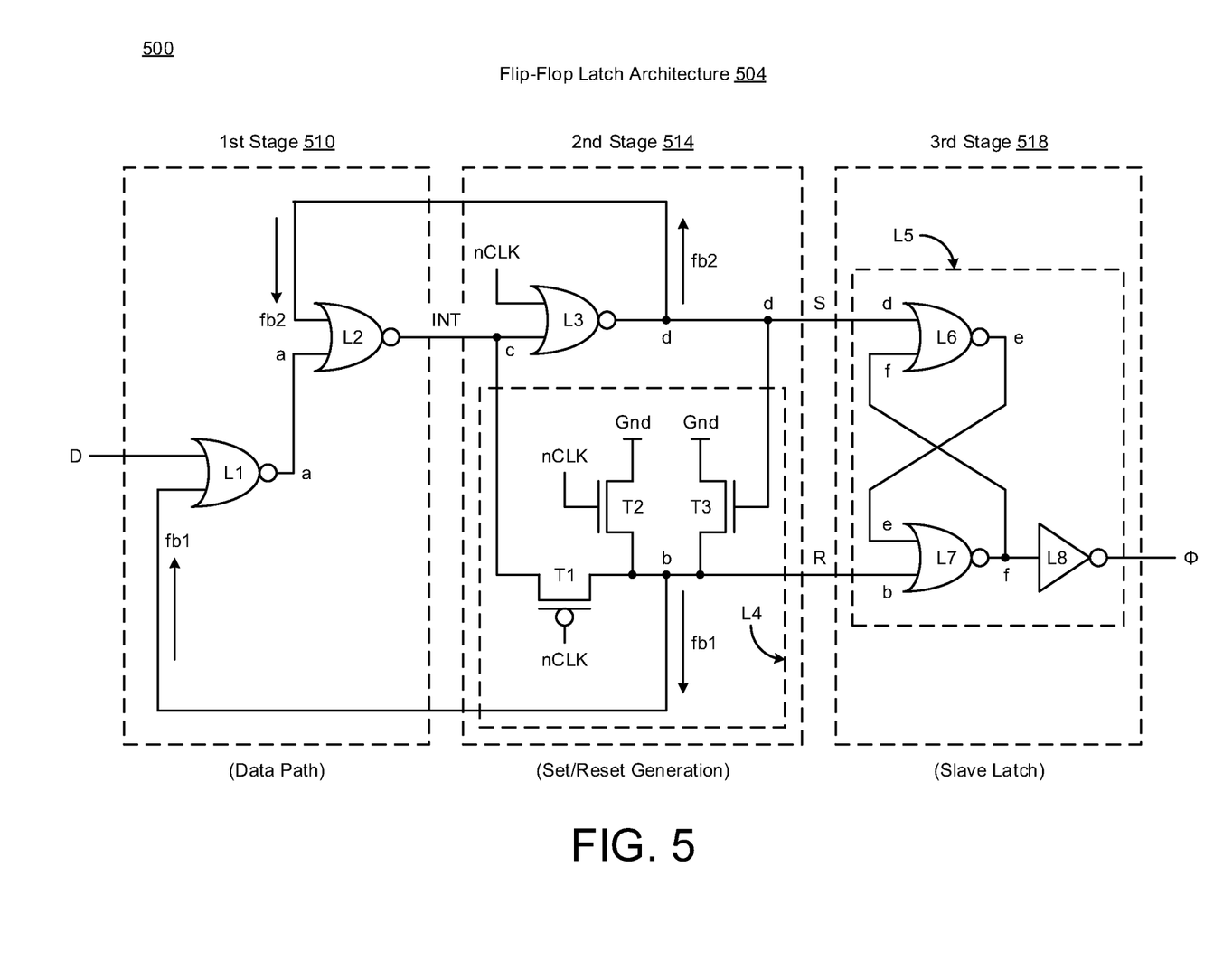
FIG. 5 illustrates a diagram of flip-flop (FF) latch architecture in accordance with various implementations described herein.

FIG. 5 illustrates a schematic diagram 500 of flip-flop (FF) latch architecture 504 in accordance with various implementations described herein. In various instances, the first, second and third stages 510, 514, 518 in FIG. 5 are similar in scope, behavior and function as the first, second and third stages 110, 114, 118 in FIG. 1.

In some implementations, the multi-stage architecture 504 may be implemented as a system or a device having integrated circuit (IC) components that are arranged and coupled together as an assemblage or combination of parts that provide for physical circuit designs and related structures. In some instances, a method of designing, providing and building the multi-stage architecture 504 as an integrated system or device may involve use of various IC circuit components described herein so as to implement set-reset signal generation schemes and techniques associated therewith. The multi-stage architecture 504 may be integrated with computing circuitry and related components on a single chip, and the multi-stage architecture 504 may be implemented in various embedded systems for automotive, electronic, mobile, server and Internet-of-things (IoT) applications.

As shown in FIG. 5, the multi-stage latch architecture 504 may have multiple stages, including, e.g., a first stage 510 and a second stage 514 that are coupled together to perform various logical behaviors. In some instances, the first and second stages 510, 514 in FIG. 5 are similar in scope and function as the first and second stages 210, 214 in FIG. 2. Also, in some instances, the multi-stage architecture 504 may be configured to operate as a latch, and in other instances, the first stage 510 and the second stage 514 may operate together as a clock gating latch. Also, the first stage 510 may be configured to provide a data path for the input data signal (D), and the second stage 514 may be configured to provide for set-reset (S-R) signal generation.

The multi-stage latch architecture 504 may also include a third stage 518 that receives the set/reset signals (S, R) from the second stage 514 at nodes (b, d) and then provides an output data signal (phi φ) based on the set/reset signals (S, R). As described herein, the third stage 518 may be configured to operate as a slave latch. The third stage 518 may include fifth logic (L5) that receives the set signal (S) from the third logic (L3) of the second stage 514, receives the reset signal (R) from the fourth logic (L4), and provides the output data signal (phi φ) based on the set signal (S) and the reset signal (R).

In some implementations, the fifth logic (L5) may have various other logic, such as, e.g., sixth logic (L6), seventh logic (L7) and/or eighth logic (L8). For instance, the sixth logic (L6) may receive the set signal (S) at node (d), receive an output signal at node (f) from the seventh logic (L7), and provide an output signal at node (e). The seventh logic (L7) may receive the reset signal (R) at node (b), receive an output signal at node (e) from the sixth logic (L6), and provide the output signal at node (f). The eighth logic (L8) may receive the output signal at node (f) from the seventh logic (L7) and provide the output data signal (phi t) as output from the third stage 518.

In some implementations, the sixth logic (L6) and/or the seventh logic (L7) may have various types of logic gates, such as, e.g., NOR gates. Also, the eighth logic (L8) may include various types of logic gates, such as, e.g., an inverter gate. However, various other relevant configurations of different logic gates may be used to implement similar logical behaviors as described herein.

In reference to FIG. 5, various implementations described herein are directed to flip-flop (FF) latching architecture having multiple stages including a first stage 510 and a second stage 514. For instance, the first stage 510 may have first NOR logic (L1, L2) that is configured to receive the input data signal (D), receive feedback signals (fb1, fb2), and provide the intermediate data signal (INT) based on the input data signal (D) and the feedback signals (fb1, fb2). The second stage 514 may have second NOR logic (L3, L4) that is configured to receive the intermediate data signal (INT), receive a clock signal (nCLK), and generate set/reset signals (S, R) based on the intermediate data signal (INT) and the clock signal (nCLK). The second NOR logic (L3, L4) may provide the set/reset signals (S, R) as the feedback signals (fb1, fb2) to the first NOR logic (L1, L2). The nCLK signal is complementary to the CLK signal.

In some implementations, the first NOR logic (L1, L2) may have a first NOR gate (L1) that receives the input data signal (D), receives the first feedback signal (fb1) of the feedback signals (fb1, fb2) from the second NOR logic (L3, L4), and then provides a first logic signal as output at output node (a). The first NOR logic (L1) may have a second NOR gate (L2) that receives the first logic signal at node (a) from the first NOR gate (L1), receives the second feedback signal (fb2) of the feedback signals (fb1, fb2) from the second NOR logic (L3, L4), and then provides the intermediate data signal (INT) to the second NOR logic (L3, L4).

In some implementations, the second NOR logic (L3, L4) may have a third NOR gate (L3) that receives the clock signal (nCLK), receives the intermediate data signal (INT) at node (c) from the second NOR gate (L2), and then provides a third logic signal at node (d) as a set signal (set) of the set/reset signals. The second NOR logic (L3, L4) may have a fourth logic gate (L4) that receives the intermediate data signal (INT) at node (c) from the second NOR gate (L2), receives the set signal (set) from the third NOR gate (L3), and then provides a fourth logic signal at node (b) as a reset signal (reset) of the set/reset signals.

Moreover, in some implementations, the multiple stages may have a third stage 518 with third NOR logic (L5) that receives the set/reset signals (S, R) from the second NOR logic (L3, L4) and then provides an output data signal (phi φ) based on the set/reset signals (S, R). The third stage 518 may be configured to operate as a slave latch. Also, the third NOR logic (L5) has multiple logic gates (L6, L7, L8) that receive the set signal (set) at node (d) from the third NOR gate (L3), receive the reset signal (reset) at node (b) from the fourth logic gate (L4), and then provide the output data signal (phi φ) based on the set signal (set) and/or the reset signal (reset).

Figure 6A:
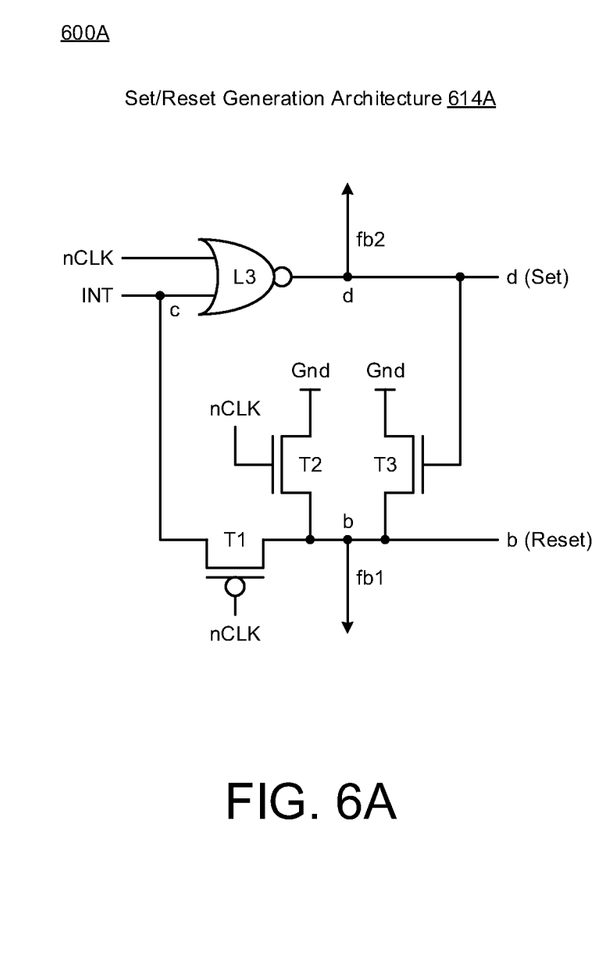
FIGS. 6A-6D illustrate various diagrams of set/reset generation architecture in accordance with various implementations described herein.
Figure 6B:
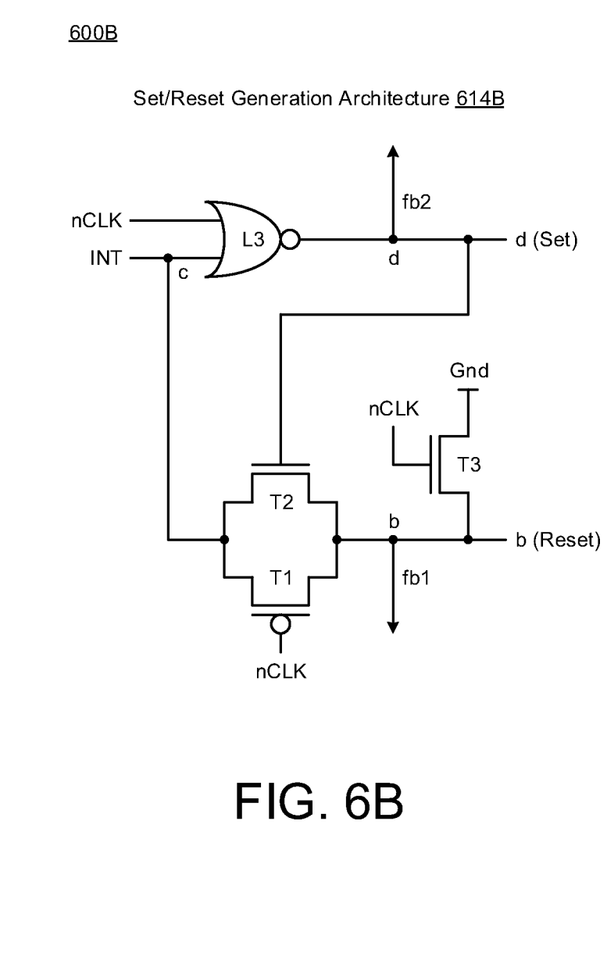
Figure 6C:
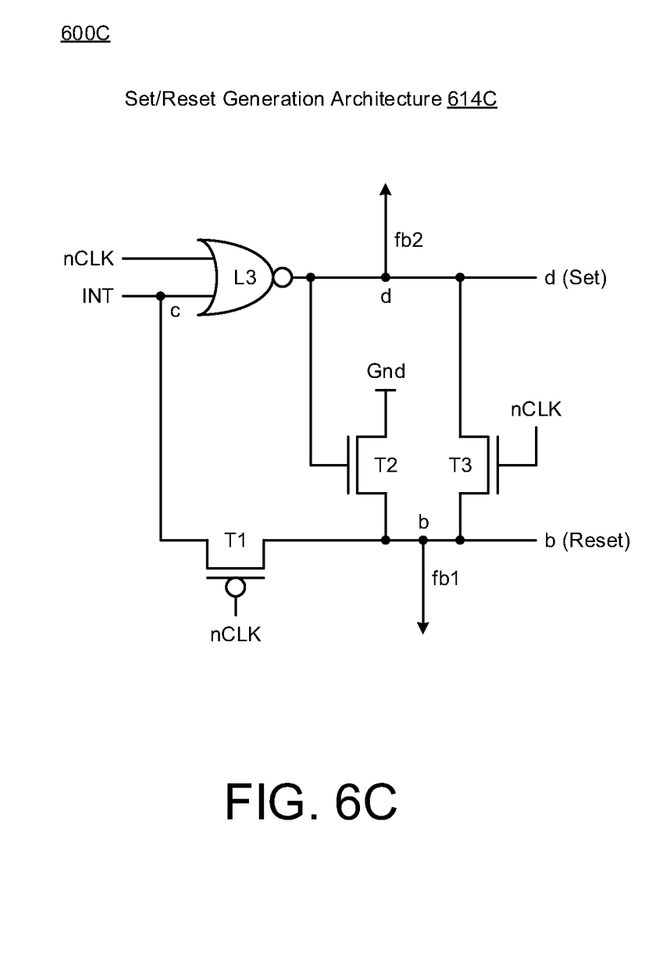
Figure 6D:
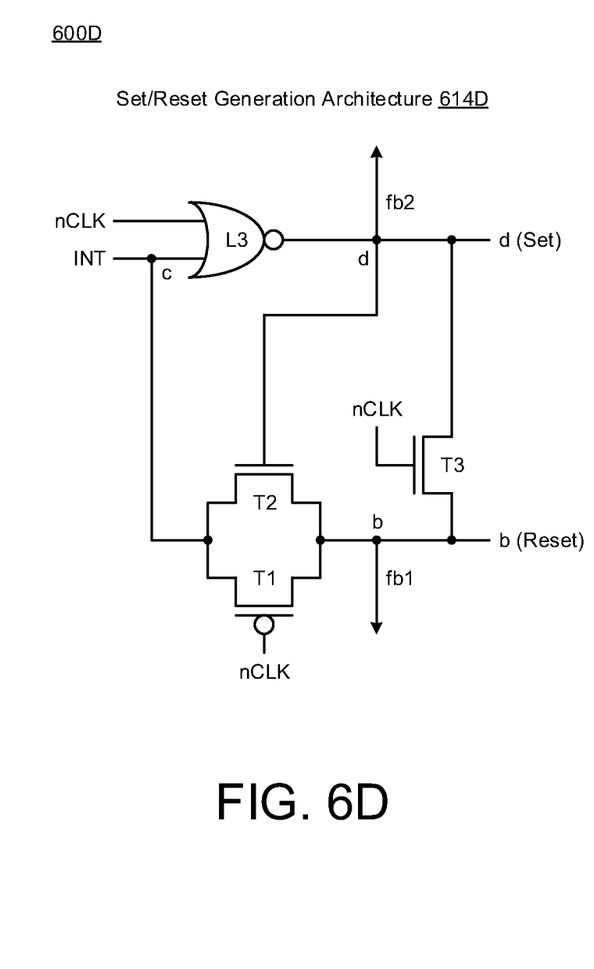

FIGS. 6A-6D illustrate various diagrams of set/reset generation architecture 614 in accordance with implementations described herein. In particular, FIG. 6A shows a first configuration diagram 600A of set/reset generation architecture 614A, FIG. 6B shows a second configuration diagram 600B of set/reset generation architecture 614B, FIG. 6C shows a third configuration diagram 600C of set/reset generation architecture 614C, and FIG. 6D shows a fourth configuration diagram 600D of set/reset generation architecture 614D. In some instances, the set/reset generation architectures 614A, 614B, 614C, 614D shown in FIGS. 6A-6D may be alternatively used for logic circuitry provided in the second stage 514 shown in FIG. 5.

As shown in FIG. 6A, the set/reset generation architecture 614A may include the third logic (L3) that receives the clock signal (nCLK), receives the intermediate signal (INT), and provides the set signal (set) at node (d). Also, the feedback signal (fb2) may be taken from node (d). The set/reset generation architecture 614A may have the multiple transistors (T1, T2, T3). The first transistor (T1) receives the intermediate signal (INT) at node (c) and then provides the reset signal (reset) at node (b) when activated by the clock signal (nCLK). The second transistor (T2) receives and provides the ground supply (Gnd) to node (b) when activated by the clock signal (nCLK), and the third transistor (T3) receives and provides the ground supply (Gnd) to node (b) when activated by the set signal (set) from node (d). Also, the feedback signal (fb1) may be taken from node (b).

As shown in FIG. 6B, the set/reset generation architecture 614B may include the third logic (L3) that receives the clock signal (nCLK), receives the intermediate signal (INT), and provides the set signal (set) at node (d). Also, the feedback signal (fb2) may be taken from node (d). The set/reset generation architecture 614B may have the multiple transistors (T1, T2, T3). The first transistor (T1) receives the intermediate signal (INT) at node (c) and then provides the reset signal (reset) at node (b) when activated by the clock signal (nCLK). The second transistor (T2) receives the intermediate signal (INT) at node (c) and then provides the reset signal (reset) at node (b) when activated by the set signal (set) from node (d). Also, the third transistor (T3) receives and provides the ground supply (Gnd) to node (b) when activated by the clock signal (nCLK). Also, the first feedback signal (fb1) may be taken from node (b).

As shown in FIG. 6C, the set/reset generation architecture 614C may include the third logic (L3) that receives the clock signal (nCLK), receives the intermediate signal (INT), and provides the set signal (set) at node (d). Also, the feedback signal (fb2) may be taken from node (d). The set/reset generation architecture 614C may have the multiple transistors (T1, T2, T3). The first transistor (T1) receives the intermediate signal (INT) at node (c) and then provides the reset signal (reset) at node (b) when activated by the clock signal (nCLK). The second transistor (T2) receives and provides the ground supply (Gnd) to node (b) when activated by the set signal (set) from node (d). Also, the third transistor (T3) receives the set signal (set) from node (d) and provides the reset signal (reset) to node (b) when activated by the clock signal (nCLK). Further, the first feedback signal (fb1) may be taken from node (b).

As shown in FIG. 6D, the set/reset generation architecture 614B may include the third logic (L3) that receives the clock signal (nCLK), receives the intermediate signal (INT), and provides the set signal (set) at node (d). Also, the feedback signal (fb2) may be taken from node (d). The set/reset generation architecture 614D may have the multiple transistors (T1, T2, T3). The first transistor (T1) receives the intermediate signal (INT) at node (c) and then provides the reset signal (reset) at node (b) when activated by the clock signal (nCLK). The second transistor (T2) receives the intermediate signal (INT) at node (c) and then provides the reset signal (reset) at node (b) when activated by the set signal (set) from node (d). The third transistor (T3) receives the set signal (set) from node (d) and then provides the reset signal (reset) to node (b) when activated by the clock signal (nCLK). Further, the first feedback signal (fb1) may be taken from node (b).

In some implementations, the third logic (L3) may refer to various types of logic gates, such as, e.g., a NOR gate, or similar. However, other relevant configurations of different logic gates may be used to implement similar logical behaviors. Also, in some implementations, transistors (T1, T2, T3) may refer to various types of transistors, such as, e.g., PMOS and NMOS transistors. In various instances, the first transistor (T1) may refer to an NMOS transistor, the second transistor (T2) may refer to a PMOS transistor, and the third transistor (T3) may refer to a PMOS transistor that may be coupled together in the different configurations, e.g., as shown in FIGS. 6A-6D. However, various other relevant transistor configurations may be utilized to implement similar logical behaviors, characteristics and/or features that are described herein.

The various schemes and techniques described herein provide advantages in physical layout design for memory applications. In some instances, the multi-stage flip-flop (FF) latching architecture described herein provides for reduced power, an improved yield, and a smaller area footprint. Also, the multi-stage flip-flop (FF) latching architecture described herein provides for improved power, performance and are (PPA) by saving area and saving power in modern process technologies, where the combinational gate based FFs described herein are more efficient than conventional FFs. Also, the multi-stage flip-flop (FF) latching architecture described herein provides a clock signal (CLK) that goes to less transistors, such as, e.g., only four transistors, which may lead to improved clock pin parasitics. Moreover, the multi-stage flip-flop (FF) latching architecture described herein may lead to improved PPA in multi-bit flip-flop (FF) applications with area savings.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with multiple stages including a first stage and a second stage. The first stage may provide a data path for an input data signal. The first stage may receive the input data signal, receive feedback signals, and provide an intermediate data signal based on the input data signal and/or the feedback signals. The second stage may provide set/reset signals based on the intermediate data signal and a clock signal. The second stage may receive the intermediate data signal, receive the clock signal, and generate the set/reset signals based on the intermediate data signal and the clock signal. The second stage may also provide the set/reset signals as the feedback signals to the first stage.

Described herein are various implementations of a multi-stage device having a first stage and a second stage. The device may include a first stage having first NAND logic configured to receive an input data signal, receive feedback signals, and provide an intermediate data signal based on the input data signal and the feedback signals. Also, the device may include a second stage having second NAND logic configured to receive the intermediate data signal, receive a clock signal, and generate set/reset signals based on the intermediate data signal and the clock signal. The second NAND logic may also provide the set/reset signals as the feedback signals to the first NAND logic.

Described herein are various implementations of a multi-stage device having a first stage and a second stage. The device may have a first stage having first NOR logic configured to receive an input data signal, receive feedback signals, and provide an intermediate data signal based on the input data signal and the feedback signals. Also, the device may have a second stage having second NOR logic configured to receive the intermediate data signal, receive a clock signal, and generate set/reset signals based on the intermediate data signal and the clock signal. The second NOR logic may provide the set/reset signals as the feedback signals to the first NOR logic.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
a first stage having multiple logic gates including a first logic gate and a second logic gate, wherein the first stage provides a data path for an input data signal, wherein an output of the first logic gate is coupled to an input of the second logic gate, wherein the first stage receives the input data signal, receives feedback signals, and provides an intermediate data signal based on the input data signal and the feedback signals; and
a second stage that provides set/reset signals based on the intermediate data signal and a clock signal, wherein the second stage receives the intermediate data signal, receives the clock signal, and generates the set/reset signals based on the intermediate data signal and the clock signal, and wherein the second stage also provides the set/reset signals as the feedback signals to the first stage,
wherein the second stage has a third logic gate that receives the intermediate data signal, receives the clock signal, and generates the set signal based on the intermediate data signal and the clock signal, and wherein the second stage has a fourth logic gate that receives the intermediate data signal, receives the set signal, and generates the reset signal based on the intermediate data signal and the set signal.

2. The device of claim 1, wherein the device operates as a latch, and wherein the first stage and the second stage are configured to operate together as a clock gating latch.

3. The device of claim 1, wherein the fourth logic gate receives the intermediate data signal, receives the set signal, receives the clock signal, and generates the reset signal based on the intermediate data signal, the set signal and the clock signal.

4. The device of claim 1, wherein the first logic gate receives the input data signal, receives a first feedback signal of the feedback signals from the second stage, and provides a first logic signal to the input of the second logic gate.

5. A device, comprising:
a first stage that provides a data path for an input data signal, wherein the first stage receives the input data signal, receives feedback signals, and provides an intermediate data signal based on the input data signal and the feedback signals; and
a second stage that provides set/reset signals based on the intermediate data signal and a clock signal, wherein the second stage receives the intermediate data signal, receives the clock signal, and generates the set/reset signals based on the intermediate data signal and the clock signal, and wherein the second stage also provides the set/reset signals as the feedback signals to the first stage,
wherein the first stage has first logic that receives the input data signal, receives a first feedback signal of the feedback signals from the second stage, and provides a first logic signal,
wherein the first stage has second logic that receives the first logic signal from the first logic, receives a second feedback signal of the feedback signals from the second stage, and provides the intermediate data signal to the second stage,
wherein the second stage has third logic that receives the clock signal, receives the intermediate data signal from the second logic, and provides a third logic signal as a set signal of the set/reset signals, and
wherein the second stage has fourth logic that receives the intermediate data signal from the second logic, receives the set signal from the third logic, and provides a fourth logic signal as a reset signal of the set/reset signals.

6. The device of claim 5, wherein the reset signal is provided to the first logic as the first feedback signal, and wherein the set signal is provided to the second logic as the second feedback signal.

7. The device of claim 5, further comprising:
a third stage that receives the set/reset signals from the second stage and provides an output data signal based on the set/reset signals,
wherein the third stage is configured to operate as a slave latch.

8. The device of claim 7, wherein the third stage has fifth logic that receives the set signal from the third logic, receives the reset signal from the fourth logic, and provides the output data signal based on the set signal and the reset signal.

9. A device, comprising:
a first stage having first NAND logic configured to receive an input data signal, receive feedback signals, and provide an intermediate data signal based on the input data signal and the feedback signals, wherein the first NAND logic has a first NAND gate and a second NAND gate, and wherein an output of the first NAND gate is coupled to an input of the second NAND gate; and
a second stage having second NAND logic configured to receive the intermediate data signal, receive a clock signal, and generate set/reset signals based on the intermediate data signal and the clock signal, wherein the second NAND logic also provides the set/reset signals as the feedback signals to the first NAND logic,
wherein the second stage has a third NAND gate that receives the clock signal, receives the intermediate data signal from the second NAND gate, and provides a set signal of the set/reset signals, and
wherein the second stage has fourth logic that receives the intermediate data signal from the second NAND gate, receives the set signal from the third NAND gate, and provides a reset signal of the set/reset signals.

10. The device of claim 9, further comprising:
a third stage having third NAND logic that receives the set/reset signals from the second NAND logic and provides an output data signal based on the set/reset signals,
wherein the third stage is configured to operate as a slave latch.

11. The device of claim 10, wherein the third NAND logic has multiple logic gates that receive the set signal from the third NAND gate, receive the reset signal from the fourth logic gate, and provide the output data signal based on the set signal and the reset signal.

12. A device, comprising:
a first stage having first NAND logic configured to receive an input data signal, receive feedback signals, and provide an intermediate data signal based on the input data signal and the feedback signals; and
a second stage having second NAND logic configured to receive the intermediate data signal, receive a clock signal, and generate set/reset signals based on the intermediate data signal and the clock signal, and wherein the second NAND logic also provides the set/reset signals as the feedback signals to the first NAND logic,
wherein the first NAND logic has a first NAND gate that receives the input data signal, receives a first feedback signal of the feedback signals from the second NAND logic, and provides a first logic signal,
wherein the first NAND logic has a second NAND gate that receives the first logic signal from the first NAND gate, receives a second feedback signal of the feedback signals from the second NAND logic, and provides the intermediate data signal to the second NAND logic,
the second NAND logic has a third NAND gate that receives the clock signal, receives the intermediate data signal from the second NAND gate, and provides a third logic signal as a set signal of the set/reset signals, and
the second NAND logic has a fourth logic gate that receives the intermediate data signal from the second NAND gate, receives the set signal from the third NAND gate, and provides a fourth logic signal as a reset signal of the set/reset signals.

* * * * *